United States Patent
Van Schaik

(10) Patent No.: US 6,924,492 B2
(45) Date of Patent: Aug. 2, 2005

(54) LITHOGRAPHIC APPARATUS, DEVICE MANUFACTURING METHOD, AND DEVICE MANUFACTURED THEREBY

(75) Inventor: Willem Van Schaik, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 220 days.

(21) Appl. No.: 10/021,296

(22) Filed: Dec. 19, 2001

(65) Prior Publication Data

US 2002/0134947 A1 Sep. 26, 2002

(30) Foreign Application Priority Data

Dec. 22, 2000 (EP) .............................................. 00311670

(51) Int. Cl.[7] .............................. A61N 5/00; G21G 5/00; G21K 5/10
(52) U.S. Cl. ................................ 250/492.1; 250/492.2; 250/492.22; 250/492.3; 250/493.1; 250/494.1; 250/495.1; 250/504 R; 378/34
(58) Field of Search .......................... 250/492.2, 492.1, 250/492.22, 492.3, 493.1, 494.1, 495.1, 504 R; 378/34; 34/61; 219/121.69, 121.84; 216/67; 355/72, 30

(56) References Cited

U.S. PATENT DOCUMENTS

| | | | |
|---|---|---|---|
| 4,532,427 A | | 7/1985 | Matthews et al. |
| 5,332,879 A | * | 7/1994 | Radhakrishnan et al. ............... 219/121.69 |
| 5,486,701 A | * | 1/1996 | Norton et al. ............... 250/372 |
| 5,958,268 A | * | 9/1999 | Engelsberg et al. ..... 219/121.84 |
| 6,198,792 B1 | * | 3/2001 | Kanouff et al. ................ 378/34 |
| 6,279,249 B1 | * | 8/2001 | Dao et al. ........................ 34/61 |
| 6,392,738 B1 | * | 5/2002 | van de Pasch et al. ........ 355/30 |
| 6,496,248 B2 | * | 12/2002 | Tanaka ......................... 355/72 |
| 6,533,952 B2 | * | 3/2003 | Klebanoff et al. ............ 216/67 |
| 6,538,716 B2 | * | 3/2003 | Mulkens et al. .............. 355/30 |

FOREIGN PATENT DOCUMENTS

| | | |
|---|---|---|
| EP | 0 532 236 A1 | 3/1993 |
| EP | 0 874 283 A2 | 10/1998 |
| EP | 0 011 128 A1 | 6/2000 |
| JP | 0 1265513 | 10/1989 |

OTHER PUBLICATIONS

Copy of International Search Report dated Jun. 29, 2001, 3 pages.
Copy of European Search Report dated Apr. 10, 2002, Application No. EP 01 31 0709.

* cited by examiner

Primary Examiner—Frank G. Font
Assistant Examiner—Mary El-Shammaa
(74) Attorney, Agent, or Firm—Pillsbury Winthrop LLP

(57) ABSTRACT

Pre-cleaning or in situ cleaning of optical components for use in a lithographic projection apparatus can be carried out by irradiating the optical component with microwave and/or infra-red radiation, preferably infra-red radiation having a wavelength or a range of wavelengths in the range of from 1000 $cm^{-1}$ to 4600 $cm^{-1}$. This technique may be suitable for cleaning a mask. By monitoring the absorption of microwave and/or infra-red radiation directed at a contaminated optical component, the degree of contamination of said component can be qualified. This method may also be suitable for reducing the partial pressure of water in EUV apparatus.

22 Claims, 1 Drawing Sheet

LITHOGRAPHIC APPARATUS, DEVICE MANUFACTURING METHOD, AND DEVICE MANUFACTURED THEREBY

BACKGROUND OF THE INVENTION

This application claims priority to EP 00311670.4 filed Dec. 22, 2000, herein incorporated by reference in its entirety.

1. Field of the Invention

The present invention relates generally to a lithographic projection apparatus and more particularly to lithographic projection apparatus including a contaminant removal system.

2. Description of the Related Art

Lithographic projection apparatus in accordance with the present invention generally include a radiation system for supplying a projection beam of radiation, a support structure for supporting patterning structure, the patterning structure serving to pattern the projection beam according to a desired pattern, a substrate table for holding a substrate, and a projection system for projecting the patterned beam onto a target portion of the substrate.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

To reduce the size of features that can be imaged using a lithographic projection apparatus, it is desirable to reduce the wavelength of the illumination radiation. Ultraviolet wavelengths of less than 180 nm are therefore currently contemplated, for example 157 nm or 126 nm. Also contemplated are extreme ultraviolet (EUV) wavelengths of less than 50 nm, for example 13.5 nm. Suitable sources of UV radiation include Hg lamps and excimer lasers. EUV sources contemplated include laser-produced plasma sources, discharge sources and undulators or wigglers provided around the path of an electron beam in a storage ring or synchrotron.

In the case of EUV radiation, the projection system will generally consist of an array of mirrors, and the mask will be reflective; see, for example, the apparatus discussed in WO 99/57596.

However, apparatus which operate at such wavelengths are significantly more sensitive to the presence of contaminant particles than those operating at higher wavelengths. Contaminant particles such as hydrocarbon molecules and water vapor may be introduced into the system from external sources, or they may be generated within the lithographic apparatus itself. For example the contaminant particles may include debris and by-products that are sputtered loose from the substrate, for example by an EUV radiation beam, or molecules produced through evaporation of plastics, adhesives and lubricants used in the apparatus.

These contaminants tend to adsorb to the optical components in the system and cause a loss in transmission of the radiation beam. When using 157 nm radiation, a loss in transmission of about 1% is observed when only one or a few monolayers of contaminant particles form on each optical surface. Such a loss in transmission is unacceptably high. Further, the uniformity requirement on the projection beam intensity for such systems is less than 0.2%. Localized contamination can cause this requirement not to be met.

There is also a risk that the adsorption of contaminant particles on the surface of the optical components, or within the optical surface in the case of a porous surface, e.g. an anti-reflection coating, may cause damage, for example cracking, to the optical components themselves. Such damage can occur if the optical components are suddenly irradiated with UV radiation, for example 157 nm radiation, at full power. The irradiation will cause rapid evaporation of the smaller contaminant particles, such as water molecules, which are trapped within said porous surface of the optical component, hence damaging the optical surface itself. Such damage is extremely costly and even a minimal risk of this occurring should be avoided. It is therefore desired that the optical components in a lithographic apparatus are kept as free of contaminants as possible.

Previous methods for cleaning optical components include, for example, the use of ozone as a cleaning material, its activity being increased by the presence of UV radiation. However, such cleaning methods are very harsh and may damage the optical component to be cleaned, particularly at its surface. In particular, the mask, which generally comprises a Teflon® (PTFE)-based or other organic material, can be damaged by the use of such methods.

A further problem associated with apparatus for use with EUV radiation relates specifically to the presence of water molecules in the apparatus. Typically, the high vacuum systems required for operation in EUV lithography tools contain a high partial pressure of water. However, the presence of water in combination with EUV radiation has a tendency to cause oxidation of mirrors. This is an irreversible and highly damaging process and leads to a very significant loss in mirror reflection. Due to the restrictively high cost of replacing the mirrors, this ultimately leads to the operation of the lithographic tool with poor reflection levels and therefore a reduction in productivity. The reduction in lifetime of the mirrors which also results is a further distinct economic disadvantage.

Oxidation protection cap layers have been suggested as a potential solution to this problem. However, very few successful results in this area have so far been demonstrated. No protective method has yet been found which can increase the lifetime of mirrors used in EUV systems to greater than 15 hours. This is considerably lower than the 10,000 hours that are desired.

SUMMARY OF THE INVENTION

One aspect of embodiments of the present invention provides a lithographic projection apparatus comprising means capable of removing contaminant particles from the optical components. Another aspect of embodiments provides a method of reducing the oxidative damage caused to mirrors in EUV systems.

This and other aspects are achieved according to the invention in a lithographic apparatus as specified above, characterized in that the apparatus further comprises:

a source for supplying radiation capable of removing contaminant particles adhered to an optical component without substantially heating said optical component.

The inventors have found that supplying such radiation, e.g. microwave and/or infra-red radiation, to a lithographic projection apparatus may have the effect of both cleaning the optical components in the system and reducing the oxidative damage to mirrors. Cleaning is carried out by directing a source of suitable radiation at an optical component in the system. The radiation may be absorbed by the contaminant molecules adsorbed to the surface of the optical component. Molecules which absorb radiation become excited and, should they gain sufficient energy, will evaporate from the surface of the optical component. Microwave and/or infra-red radiation can therefore be used in this manner to remove adsorbed contaminants from optical components.

The invention provides a mild, yet effective manner of cleaning optical components in lithographic projection apparatus. After cleaning, the transmission of the radiation beam is increased and the uniformity is also improved. Further, cleaning the optical components significantly reduces the number of small molecules such as water which are adsorbed to a surface of the optical component (optical surface). This in turn reduces the likelihood of cracks forming in, or other damage occurring to, the optical components due to the uncontrolled evaporation of such molecules when irradiated with the UV projection beam.

The use of the present invention also avoids damage to the delicate optical surfaces which may be present in the apparatus. In particular, the intensity of the microwave and/or infra-red radiation can be varied, allowing initial radiation to be carried out at a low intensity. This method is therefore suitable for use with, for example, teflon-comprising masks.

Materials used for optical components are for example, $CaF_2$, $BaF_2$, $MgF_2$ and quartz which may or may not have a low number of hydroxyl groups. If these materials are irradiated with infra-red radiation having relatively low frequencies, these materials absorb the infra-red radiation and as a consequence may substantially heat up. An example of using infra-red radiation to heat optical elements in a lithographic projection apparatus can be gleaned from EP 0 532 236 A1. However, when the heat load of the projection beam on the optical component is relatively low, heating up of said components is generally undesirable as it will affect the optical properties of the optical component and hence may negatively influence the imaging performance of the apparatus. Whether optical components will substantially and unacceptably heat up upon exposure generally depends on the type of material and the size and shape of the optical component, for example. For this reason radiation which is 10%, 20% or even 30% absorbed by the optical component may still be suitable for the present invention. In order to selectively remove contaminant particles without substantially heating the optical component, infra-red radiation above 1000 $cm^{-1}$ is suitable for optical components made of $CaF_2$ and radiation above 2800 $cm^{-1}$ for components made of quartz.

An additional advantage of using such infra-red radiation (which is not absorbed by the optical component) is that both sides of each optical component may be cleaned simultaneously using a single infra-red source. Further, the method is efficient since the radiation is specifically absorbed by the contaminants rather than the optical component itself. The cleaned optical components are not themselves substantially heated by the cleaning process and can therefore be used immediately for an exposure.

The lithographic apparatus of the invention may also reduce the oxidative damage to mirrors which tends to occur in EUV systems. In this embodiment of the invention, the apparatus is irradiated with infra-red or microwave radiation having a frequency which corresponds to a rotational or vibrational frequency of water. By illuminating at such a frequency, the water molecules in the apparatus are selectively heated. This causes evaporation and removal of the water molecules which may be adsorbed to the various surfaces in the apparatus, thereby reducing oxidation of mirrors.

Since this method selectively targets water molecules, this provides an efficient manner in which water can be removed from the system, while avoiding heating the apparatus itself. This increases the life-time of EUV mirrors which is essential for the economic viability of EUV equipment, without sacrificing the demands on thermal stability of the tool, a feature which is required for low down-time.

According to a further aspect of the invention there is provided a device manufacturing method including:

providing a substrate that is at least partially covered by a layer of radiation-sensitive material;

providing a projection beam of radiation using a radiation system;

using patterning structure to endow the projection beam with a pattern in its cross-section;

projecting the patterned beam of radiation onto a target portion of the layer of radiation-sensitive material, characterized by the step of:

removing contaminant particles which are adhered to an optical component by irradiation with radiation capable of removing said contaminant particles without substantially heating said optical component.

In addition, the method may further include determining the level of contamination of the optical component by irradiating said optical component with microwave and/or infra-red radiation and monitoring the degree of absorption of said radiation.

This latter method provides that the level of contamination of the optical components in the apparatus can be determined, usually prior to exposure. If the degree of absorption is undesirably high, indicating the presence of contaminants on the optical surfaces, cleaning can be carried out, or continued, either using the method of the invention or using other methods. This provides that exposure can be delayed until it is known that the contaminant levels are acceptable. It is therefore possible to ensure that the transmission and uniformity levels during every exposure are high, thus maximizing the efficiency of the apparatus.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

The invention and its attendant advantages will be further described below with reference to exemplary embodiments and the accompanying schematic drawings, in which.

In the drawings, like parts are identified by like references.

DETAILED DESCRIPTION OF EMBODIMENTS OF THE INVENTION

Embodiment 1

Figure 1:
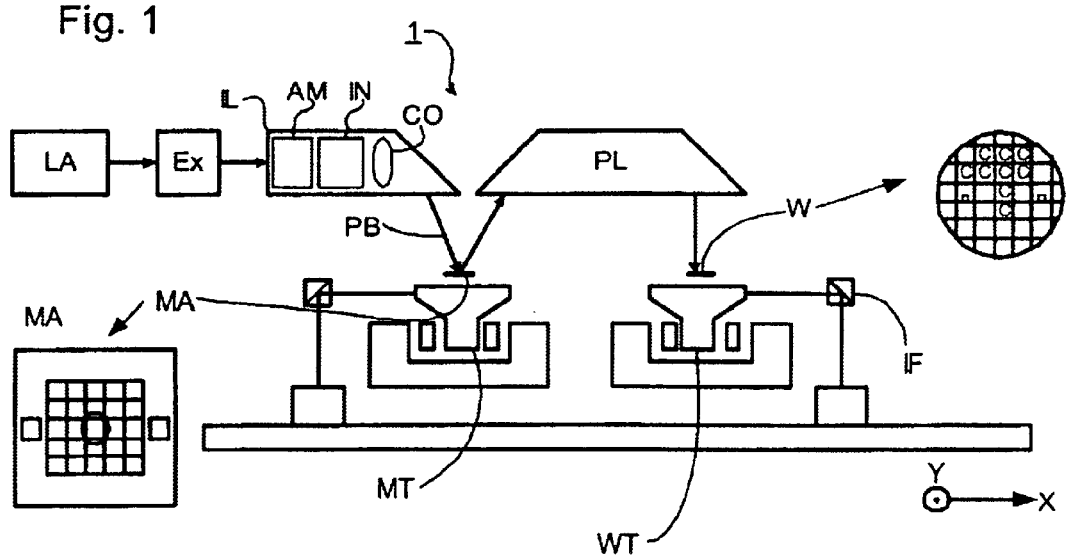
FIG. 1 depicts a lithographic projection apparatus according the invention.

FIG. 1 schematically depicts a lithographic projection apparatus according to a particular embodiment of the invention. The apparatus comprises:

- a radiation system Ex, IL, for supplying a projection beam PB of radiation (e.g. UV or EUV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a mirror group) for imaging an irradiated portion of the mask MA onto a target portion C (e.g. comprising one or more dies) of the substrate W. As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a Hg lamp, an excimer laser, an undulator or wiggler provided around the path of an electron beam in a storage ring or synchrotron or a laser-produced plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In a specific embodiment of the present invention, an optical component is cleaned of contaminant particles by directing a beam of infra-red or microwave radiation at an optical component to be cleaned. For example, the optical component to be cleaned may be the mask. However, the present invention may be used to remove contaminants from any component in the system, for example the optical components (or lenses) contained within the illumination or projection systems. The present invention can be applied to one or several optical components either simultaneously or separately.

In this embodiment it will be assumed that the radiation system produces UV light with a wavelength of 157 nm, although other wavelengths, such as 126 nm, may also be used.

Figure 2:
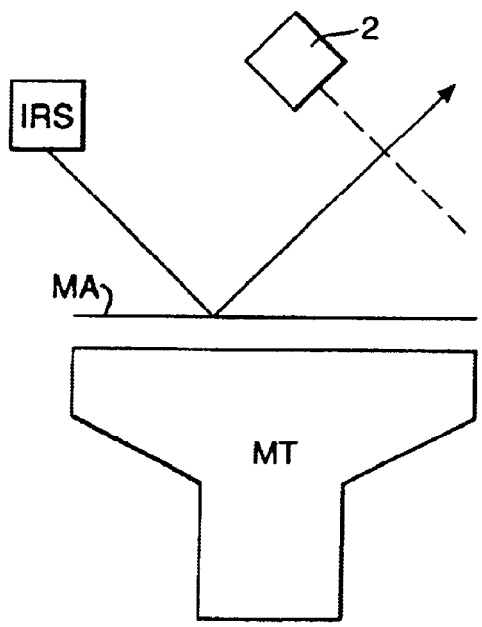
FIG. 2 depicts the mask stage of a specific embodiment of the invention.

FIG. 2 shows the mask stage of this embodiment of the invention in more detail. The mask M is irradiated with microwave and/or infra-red radiation. In the embodiment of the invention depicted in FIG. 2 the radiation is infra-red radiation generated from infra-red source IRS. Any contaminant molecules which absorb the radiation will gain energy and may evaporate from the surface to which they are adsorbed. Irradiation may take place prior to or simultaneously with exposure. It is also envisaged that the mask, or other optical component which requires cleaning, may be irradiated prior to insertion in the lithographic projection apparatus.

Suitable sources of infra-red radiation IRS include incandescent lamps. Suitable sources of microwave radiation include cavity resonators, backward wave oscillators and "Klystrons". The source may be a broad band emitter which provides radiation of a range of wavelengths, or may provide radiation of a single, or a narrower range of wavelengths. Preferably the source is adjustable so that it can be tuned to different wavelengths; filters may also be used to select desired wavelengths.

The bonds within any molecule rotate and vibrate at specific frequencies. Generally, rotational frequencies lie in the microwave region and vibrational frequencies in the infra-red region. Therefore, irradiating at one or a range of wavelengths in these regions causes excitation, via rotation or vibration, of the contaminant molecule leading to its removal. Suitable wavelengths or ranges of wavelengths for the microwave or infra-red radiation fall within the range 0.3 cm$^{-1}$ to 4600 cm$^{-1}$, typically from 1 to 100 cm$^{-1}$ if rotational excitation is used (microwave region) or from 400 to 4600 cm$^{-1}$ if vibrational excitation is used (infra-red region).

One embodiment of the present invention involves targetting one or more specific contaminant molecules by irradiating at a characteristic rotational or vibrational frequency of that molecule, or of a bond within that molecule. For example, when considering vibrational excitation, an alkyl C—H bond has a stretching frequency in the range 2800 cm$^{-1}$ to 3000 cm$^{-1}$ and an O—H bond has a stretching frequency in the range 2800 cm$^{-1}$ to 3800 cm$^{-1}$. The precise frequency of each vibration in any given molecule will be determined by a number of factors such as steric influences and non-covalent bonding (e.g. hydrogen bonding). Approximate vibration frenquencies for a variety of chemical bonds are given in the table below:

| Vibration | Frequency (cm$^{-1}$) |
|---|---|
| O—H | 2800–3800 |
| O—H (Si—OH) | 3800 |
| O—H (Si—OH) | 4600 |
| C—H | 2960 |
| C—C | 900 |
| C=C | 1650 |
| C=O | 1700 |
| S=O | 1310 |
| C—F | 650 |
| Si—Si | 430 |

Infrared radiation of one of the above specific frequencies or a range of frequencies including one of the above frequencies can therefore be used to excite a molecule containing the corresponding type of bond.

Many of the contaminant molecules present in a lithographic apparatus contain O—H bonds, for example water and alcohols, and therefore a suitable range of frequencies is from 2800 cm$^{-1}$ to 3800 cm$^{-1}$. The vibration frequency of water is at the upper end of this range, so if it is desired to specifically target water molecules, a frequency of 3500 cm$^{-1}$ to 3800 cm$^{-1}$ can be used. Similarly, other contaminants can be targeted by irradiating the optical component with radiation having a frequency which corresponds to a vibration frequency of the relevant contaminant. Several frequencies may be irradiated in turn or simultaneously such that several different contaminants are targeted.

While it may be desirable to use a certain wavelength to remove a particular type of contaminant, it may alternatively be required that a broad range of wavelengths be used, for example by using a broad-band emitter as the source of microwave and/or infra-red radiation. This will energize, and cause evaporation of, a wide variety of different molecules at once.

If desired, the absorption of the microwave and/or infra-red radiation can be monitored using sensor 2. This is described further in embodiment 2.

It is envisaged that the cleaning method of the present invention may be used in combination with other cleaning methods, for example methods involving the use of ozone and/or UV radiation.

Embodiment 2

In a second embodiment of the invention, which is the same as the first embodiment, except as described below, the apparatus is fitted with a sensor 2 to monitor the absorption of the infra-red radiation by the contaminants on the surface of the optical components. As for embodiment 1, infra-red radiation has here been utilised, but it is also envisaged that microwave radiation may be used. In FIG. 2, sensor 2 is depicted as monitoring the absorption of infra-red radiation directed at the mask, but it may also be used to monitor absorption of radiation directed at any optical component.

As is depicted in FIG. 2, the optical component may be reflective, and the sensor will therefore measure the reflectance of the infra-red radiation. However, if the mask is of a transmissive type, the sensor will be positioned such that it measures the degree of transmission through the mask or other optical component.

The degree of absorption of the infra-red radiation indicates the degree of coverage of the optical component with contaminants. Thus, the sensor may be used to indicate whether the optical component in question is sufficiently clean for exposure to take place, or whether further cleaning is required. Regular use of this detection process may be desirable so that it can be determined when an optical component requires cleaning.

The sensor may also be used during the cleaning process. Cleaning is carried out as described in Embodiment 1, and while irradiation is taking place, the absorption of said radiation is monitored using sensor 2. When the sensor indicates that the absorption level has dropped below a sufficient level, and thus the contamination level of the optical component is acceptable, the cleaning process may be stopped and exposure carried out.

Further, if the sensor indicates that the optical component has not been sufficiently cleaned by the infra-red method of the present invention, other techniques may be employed.

Embodiment 3

In a third embodiment of the invention, which is the same as the first embodiment except as described below, the partial pressure of water in the system is reduced by irradiating with infra-red or microwave radiation, preferably infra-red radiation.

In this embodiment, the radiation system produces radiation in the extreme ultraviolet (EUV) range. For example, the radiation may have a wavelength below about 50 nm, preferably below about 20 nm and most preferably below about 15 nm. An example of a wavelength in the EUV region which is gaining considerable interest in the lithography industry is 13.5 nm, though there are also other promising wavelengths in this region, such as 11 nm, for example.

In this embodiment the interior of the lithographic apparatus is irradiated with IR light from IR source IRS. The frequency of the radiation is a frequency which is absorbed by water molecules. For example a frequency or a range of frequencies within the range of from 3500 cm$^{-1}$ to 3800 cm$^{-1}$, preferably about 3400 cm$^{-1}$ (2.94:m). It is preferred that the radiation is a single frequency or a narrow range of frequencies.

Irradiation may be dynamically controlled with a very short response period. Sensor 2, which may in this embodiment be a mass spectrometer which can measure the partial pressure of water in the apparatus, may be used to dynamically control the irradiation. Thus, a pulse of irradiation may be applied to the system when the sensor indicates that the partial pressure of water has risen above a particular level.

Irradiation in this manner causes evaporation and removal of water molecules and thus eventually decreases the partial pressure of water in the system below an acceptable level. This leads to a reduction in oxidation of any mirrors present in the apparatus. Exposure may be carried out at any time after IR irradiation, including immediately afterwards, since the apparatus itself is not heated during IR irradiation and there is therefore no need for a cooling period. IR irradiation may alternatively be carried out simultaneously with exposure.

While we have described above specific embodiments of the invention it will be appreciated that the invention may be practiced otherwise than described. The description is not intended to limit the invention.

What is claimed is:

1. A lithographic projection apparatus comprising:
   a radiation system to provide a projection beam of radiation;
   a support structure constructed and arranged to support patterning structure, the patterning structure which can be used to pattern the projection beam according to a desired pattern;
   a substrate table to hold a substrate; and
   a radiation source independent of the radiation system constructed and arranged to supply microwave or infra-red radiation capable of removing contaminant particles adhered to an optical component without substantially heating said optical component.

2. An apparatus according to claim 1, wherein said infra-red radiation comprises at least one frequency in the range of from 1000 $cm^{-1}$ to 4600 $cm^{-1}$.

3. An apparatus according to claim 1, wherein the infra-red radiation comprises a range of frequencies of from 1000 $cm^{-1}$ to 4600 $cm^{-1}$.

4. An apparatus according to claim 1, wherein the optical component comprises a compound selected from a group comprising $CaF_2$, $BaF_2$, and $MgF_2$.

5. An apparatus according to claim 1, wherein said infra-red radiation comprises at least one frequency in the range of from 2800 $cm^{-1}$ to 4600 $cm^{-1}$.

6. An apparatus according to claim 5, wherein the infra-red radiation comprises a range of frequencies in the range of from 2800 $cm^{-1}$ to 4600 $cm^{-1}$.

7. An apparatus according to claim 5, wherein the optical component comprises quartz.

8. An apparatus according to claim 1, wherein said infra-red radiation comprises at least one frequency in the range of from 1 to 100 $cm^{-1}$.

9. An apparatus according to claim 5, wherein the infra-red radiation comprises a range of from 1 to 100 $cm^{-1}$.

10. A device manufacturing method comprising:
    projecting a patterned beam of radiation onto a target portion of a layer of radiation-sensitive material on a substrate; and
    removing contaminant particles, which are adhered to an optical component through which the beam of radiation passes, by irradiation with a microwave or infra-red radiation source independent of a source of the patterned beam, said radiation source providing a radiation capable of removing said contaminant particles without substantially heating said optical component.

11. A method according to claim 10, wherein said irradiation with said radiation is carried out simultaneously with exposure to the projection beam.

12. A method according to claim 10, further comprising:
    determining a level of contamination of the optical component by irradiating said optical component with microwave and/or infra-red radiation and monitoring the degree of absorption of said radiation.

13. A method according to claim 11, further comprising:
    determining a level of contamination of the optical component by irradiating said optical component with microwave and/or infra-red radiation and monitoring the degree of absorption of said radiation.

14. A method according claim 10, wherein particles are water.

15. A device manufactured according to the method of claim 10.

16. An apparatus according to claim 1, wherein the radiation source is an adjustable radiation source which can be tuned to different wavelengths.

17. An apparatus according to claim 1, wherein the wavelength of the radiation is selected by a filter.

18. An apparatus according to claim 1, wherein the radiation source is a broad band radiation source.

19. An apparatus according to claim 1, further comprising a radiation sensor constructed and arranged to monitor a level of contamination of the optical component.

20. An apparatus according to claim 19, wherein the level of contamination is monitored by analyzing an absorption of the radiation by the contaminant particles.

21. An apparatus according to claim 19, wherein the radiation sensor is a mass spectrometer.

22. An apparatus according to claim 1, wherein the radiation source is a source selected from the group consisting of an incandescent lamp, a cavity resonator, a backward wave oscillator and a Klystron.

* * * * *